United States Patent
Voo et al.

(12) 
(10) Patent No.: US 6,320,796 B1
(45) Date of Patent: Nov. 20, 2001

(54) VARIABLE SLOPE CHARGE PUMP CONTROL

(75) Inventors: Thart Fah Voo, Singapore (SG); Sehat Sutardia, Cupertino, CA (US)

(73) Assignee: Marvell International, Ltd. (BM)

( * ) Notice: Subject to any disclaimer, the term of this patent is extended or adjusted under 35 U.S.C. 154(b) by 0 days.

(21) Appl. No.: 09/710,255

(22) Filed: Nov. 10, 2000

(51) Int. Cl.[7] ................................ G11C 7/00; G05F 1/10
(52) U.S. Cl. .................... 365/189.09; 365/226; 327/538; 327/543
(58) Field of Search .................... 365/189.09, 189.11, 365/226; 327/530, 538, 543, 544

(56) References Cited

U.S. PATENT DOCUMENTS

| | | | |
|---|---|---|---|
| 4,527,180 | * 7/1985 | Oto | 357/23.6 |
| 6,107,862 | * 8/2000 | Mukainakano et al. | 327/536 |
| 6,107,864 | 8/2000 | Fukushima et al. | 327/536 |
| 6,191,994 | * 2/2001 | Ooishi | 365/226 |

* cited by examiner

*Primary Examiner*—Son Mai
(74) *Attorney, Agent, or Firm*—Harness, Dickey & Pierce, P.L.C.

(57) ABSTRACT

The present invention provides a circuit and method for generating a regulated voltage from a first voltage of a first voltage source. The circuit includes a driver for generating a drive signal. A charge pump is coupled to the driver for generating a pump voltage from the first voltage source. The charge pump generates the pump voltage in response to the drive signal. The charge pump includes at least two charging modes. An amplifier has a reference input coupled to a reference voltage, and a sense input coupled to a sense signal representative of the pump voltage. In response to a difference between the reference voltage and the sense signal, the amplifier generates an output to control the driver. A pump controller is coupled from the amplifier output to the charge pump. The pump controller includes a measuring device that is operable in response to a mode criteria, to select a charging mode of the charge pump.

29 Claims, 4 Drawing Sheets

VARIABLE SLOPE CHARGE PUMP CONTROL

BACKGROUND OF THE INVENTION

1. Field of the Invention

The present invention relates generally to charge pump circuits, and in particular to charge pump circuits that provide a regulated output voltage.

2. Discussion of the Related Art

A charge pump circuit is generally used for boosting a power supply voltage to a higher voltage level to be used for powering ancillary circuits. Closed loop control is sometimes used with charge pumps to provide a regulated output voltage. However, charge pumps that include closed loop control typically have extremely slow response times due to the relatively small amount of energy that can be transferred during each clock cycle. Exacerbating the slow response times is the effect of inherent leakage currents that occur within the charge pump. When diodes within the charge pump are back biased, a small but significant leakage current flows backwards through the diode. The leakage current transfers charge out of the output storage devices back to the voltage supply, causing the output voltage to slowly decrease. The output voltage continues to decrease until the output controller detects an error of sufficient magnitude between the output voltage and the voltage reference. The controller then enables several cycles of energy to be transferred to the output storage devices. However, due to the slow response of the controller, the output voltage will typically overshoot slightly. Then, the cycle of leakage current, decreasing output voltage, slow response controller starts anew. The steady-state effect is a low-magnitude, low-frequency oscillation occurring on the output voltage that is somewhat related to the magnitude of the leakage current. Compensating for the effect of leakage currents prior to manufacturing is problematic, since the magnitude of leakage currents are dependent on several factors including the semiconductor manufacturing process, die defects, and temperature.

SUMMARY OF THE INVENTION

The present invention provides a circuit and method for generating a regulated voltage from a first voltage of a first voltage source. The circuit includes a driver for generating a drive signal. A charge pump is coupled to the driver for generating a pump voltage from the first voltage source. The charge pump generates the pump voltage in response to the drive signal. The charge pump includes at least two charging modes. An amplifier has a reference input coupled to a reference voltage, and a sense input coupled to a sense signal representative of the pump voltage. In response to a difference between the reference voltage and the sense signal, the amplifier generates an output to control the driver. A pump controller is coupled from the amplifier output to the charge pump. The pump controller includes a measuring device that is operable in response to a mode criteria, to select a charging mode of the charge pump.

For a more complete understanding of the invention, its objects and advantages, reference may be had to the following specification and to the accompanying drawings.

DETAILED DESCRIPTION OF THE PREFERRED EMBODIMENT

Figure 1:
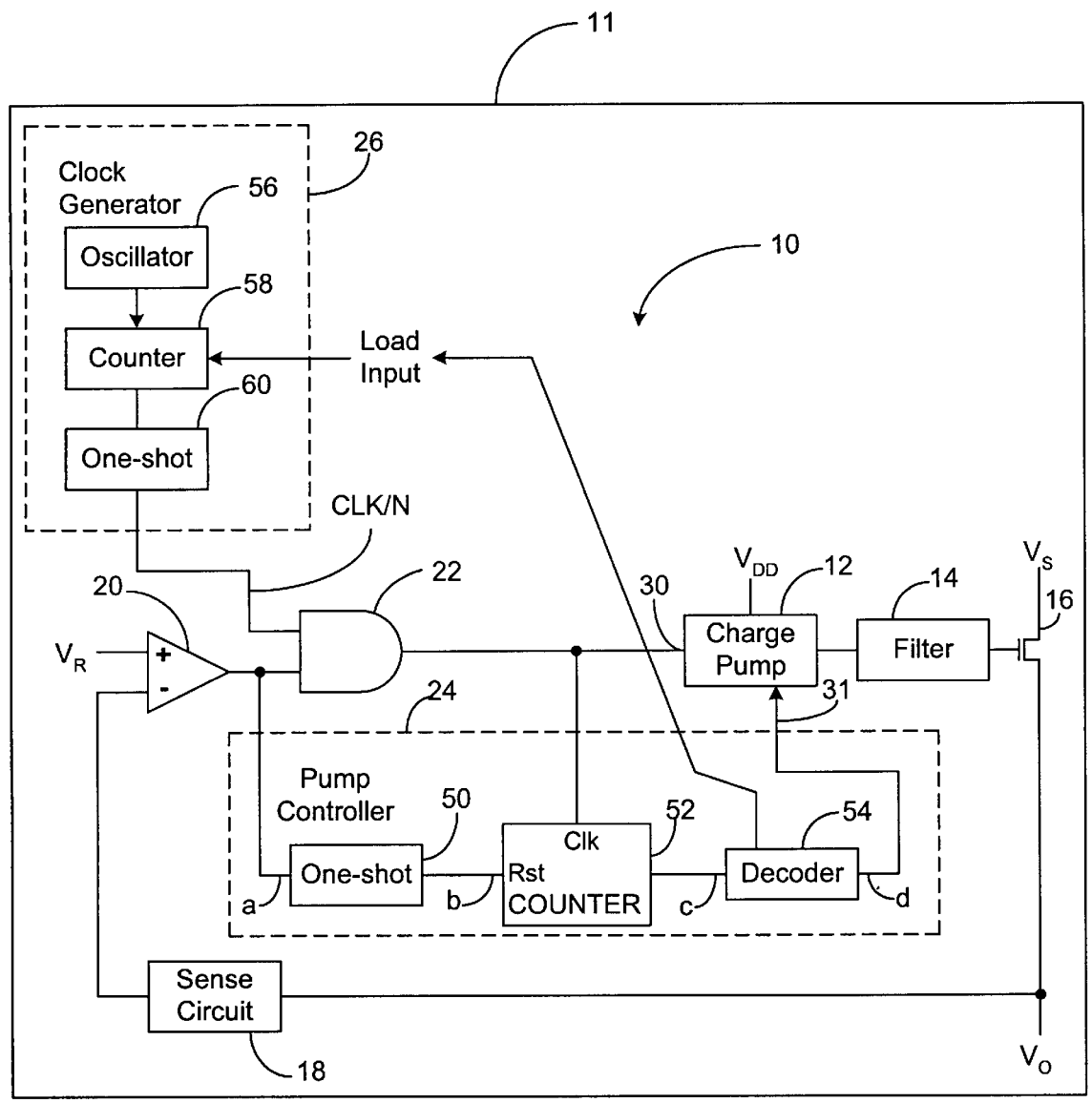
FIG. 1 illustrates a block diagram of a variable slope charge pump regulator circuit in accordance with the teachings of the invention.

Referring to FIG. 1, illustrated is a presently preferred embodiment of a variable slope charge pump regulator circuit 10 constructed in accordance with the principles of the present invention. The regulator circuit 10 converts power from a voltage source to a regulated output. The present invention is particularly suitable when incorporated into a semiconductor device 11 for providing power to on-chip circuitry such as an output driver stage. While the present invention is shown and described as being incorporated into a semiconductor device 11, it will be appreciated that the circuit and method may be embodied in a variety of devices including a combination of discrete devices, an application specific integrated circuit, and a field programmable array. The regulator circuit 10 includes a charge pump circuit 12 for boosting voltage from a voltage source, $V_{DD}$. High frequency components in the boosted voltage are attenuated by a filter 14. The filtered voltage is used to drive a voltage buffer 16 that converts power from another voltage source, $V_S$, to an output voltage, $V_O$, that is proportional to the voltage level of the filtered voltage. A sense circuit 18 couples a voltage corresponding to the output voltage to the input of an amplifier 20. The sense circuit 18 in the preferred embodiment is a direct connection to the output of the voltage buffer 16. However, as those skilled in the art will readily recognize, the scope of the invention encompasses other sense circuits such as resistor divider networks. The amplifier 20 compares the sense voltage to a reference voltage that is coupled to another input of the amplifier 20. An error signal is generated by the amplifier 20 based upon the comparison of the sense voltage and reference voltage. The output of the amplifier 20 is coupled to a driver 22 and a pump controller 24. The driver 22 generates a pulsed drive signal to drive the charge pump 12. The driver 22 in the presently preferred embodiment is an AND gate. However, any suitable device for driving the input of the charge pump circuit 12 is within the scope of the invention, such as devices having push-pull and totem-pole outputs. The pump controller 24 controls the charging mode of the charge pump circuit 12. In the presently preferred embodiment of the invention, the charging mode of the charge pump circuit 12 is changed by varying the value of the capacitors within the charge pump circuit 12. A clock generator 26 generates a controlled clock signal that is coupled to another input of the driver 22. The controlled clock signal is set to compensate for changes in the load on the charge pump circuit 12 such as leakage currents and steady-state output load changes.

The charge pump circuit 12 boosts power coupled from a voltage source, $V_{DD}$, to a power input 28, up to an unregulated output voltage ranging in value from $V_{DD}$ to $2*V_{DD}$. The operation of the charge pump circuit 12 is controlled by the drive signal that is coupled to a drive input 30, as well as a mode control input 31. The drive signal is typically a pulsating waveform that alternately causes energy to be cycled into a series capacitor, and then out of the series capacitor into a storage capacitor. The output voltage of conventional charge pump circuits varies with the duty cycle and frequency of the drive input, the voltage level of $V_{DD}$, the voltage level of the driver output, capacitor values, and load. The scope of the invention encompasses using all known unregulated charge pump circuits within the described system and method. Two such conventional charge pump circuits are illustrated in FIGS. 3A and 3B.

Figure 3A:
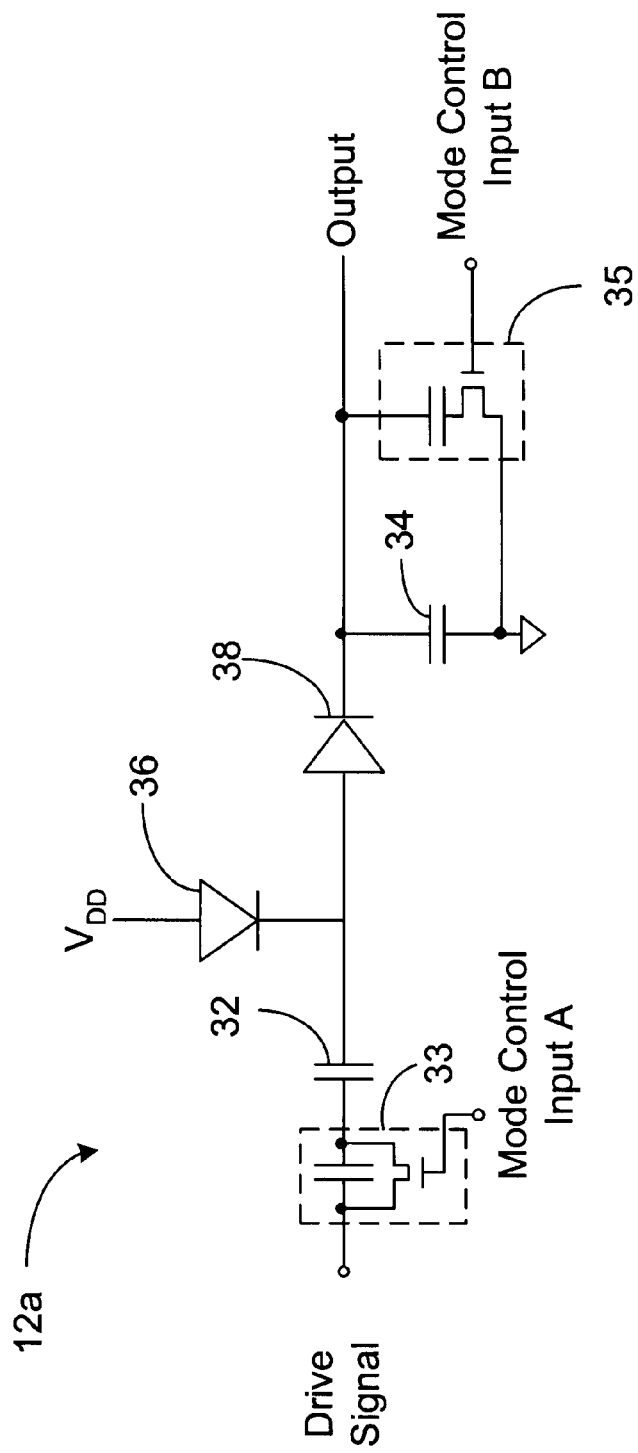
FIG. 3A illustrates a conventional charge pump.

Referring to FIG. 3A, a single stage charge pump circuit 12a is illustrated. The charge pump circuit 12a includes a series capacitor 32, storage capacitor 34, and coupling diodes 36 and 38. In operation, when the drive signal is in the low state, energy from $V_{DD}$ is stored in the series capacitor 32 charging the capacitor 32 up to $V_{DD}$. Then, when the drive signal transitions to the high state, the summation of the energy stored in the series capacitor 32 and energy provided by the drive signal is transferred through the coupling diode 38 charging up the storage capacitor 34. The peak voltage level stored in the storage capacitor 34 is approximately the voltage amplitude of the drive signal plus the voltage of the series capacitor 32. Coupled across each of the capacitors 32 and 34 is mode control circuitry for controlling the charge rate of the charge pump. The mode control circuitry preferably comprises two charge rate circuits 33 and 35 that are coupled to the series capacitor 32 and the storage capacitor 34. The charge rate circuits 33 and 35 switch capacitors in parallel with capacitors 32 or 34, or out of the circuit to vary the charging rate of the circuit. Although the presently preferred embodiment employs a series combination of an NMOSFET and capacitor as the charge rate circuit, using other charge rate circuits 33 and 35 such as bipolar junction transistor-capacitor combinations and parallel combinations of a FET and capacitor that switch in series with capacitors 32 and 34 are within the scope of the invention. In addition, the charge pump energy may be controlled by varying the ration of capacitors 32 and 34, as well as varying $V_{DD}$.

Figure 4:
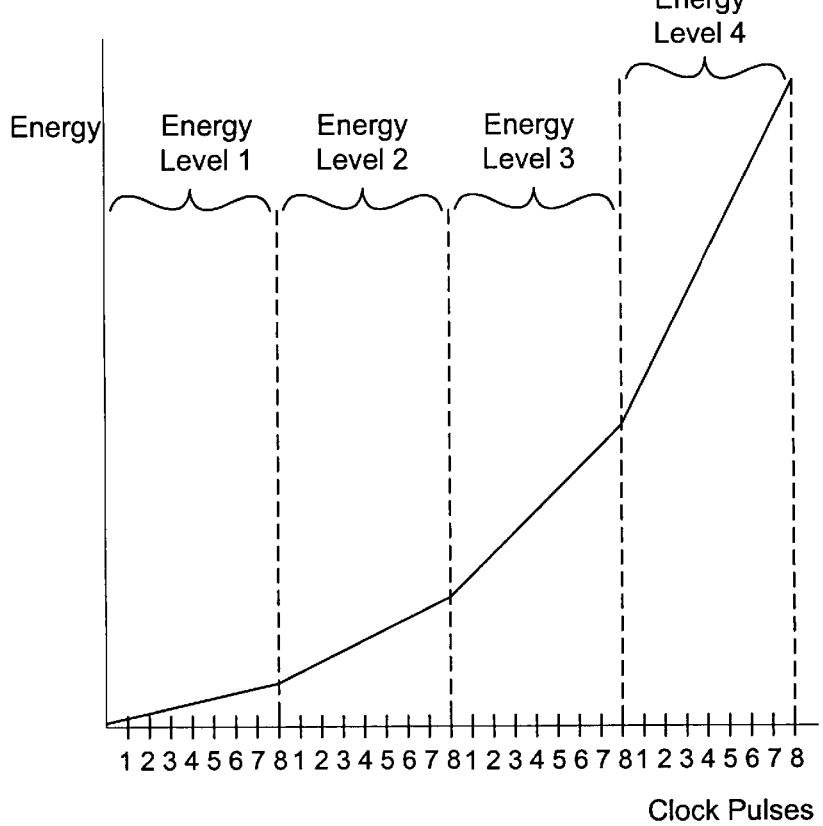
FIG. 4 illustrates a diagram of energy level versus charging mode.

Referring to FIG. 4, a charging mode versus energy level diagram corresponding to the charge pump circuit 12a is illustrated. The charge pump circuit 12 may be configured to provide an unlimited number of charging modes during which predetermined levels of energy are transferred to the output. Specifically, charge pump circuit 12a is configured to provide four distinct energy levels by controlling the two charge rate circuits 33 and 35 during different charging modes. Controlling the two charge rate circuits 33 and 35 provides four separate charge modes by varying the ratio of the series capacitor to the parallel capacitor, as well as varying the absolute values of the series capacitor and the parallel capacitor. The rate at which energy is transferred to the output increases as the energy level is varied from energy level 1 to energy level 4. The rate of energy transfer may also be controlled by varying the frequency of the clock pulses.

Figure 3B:
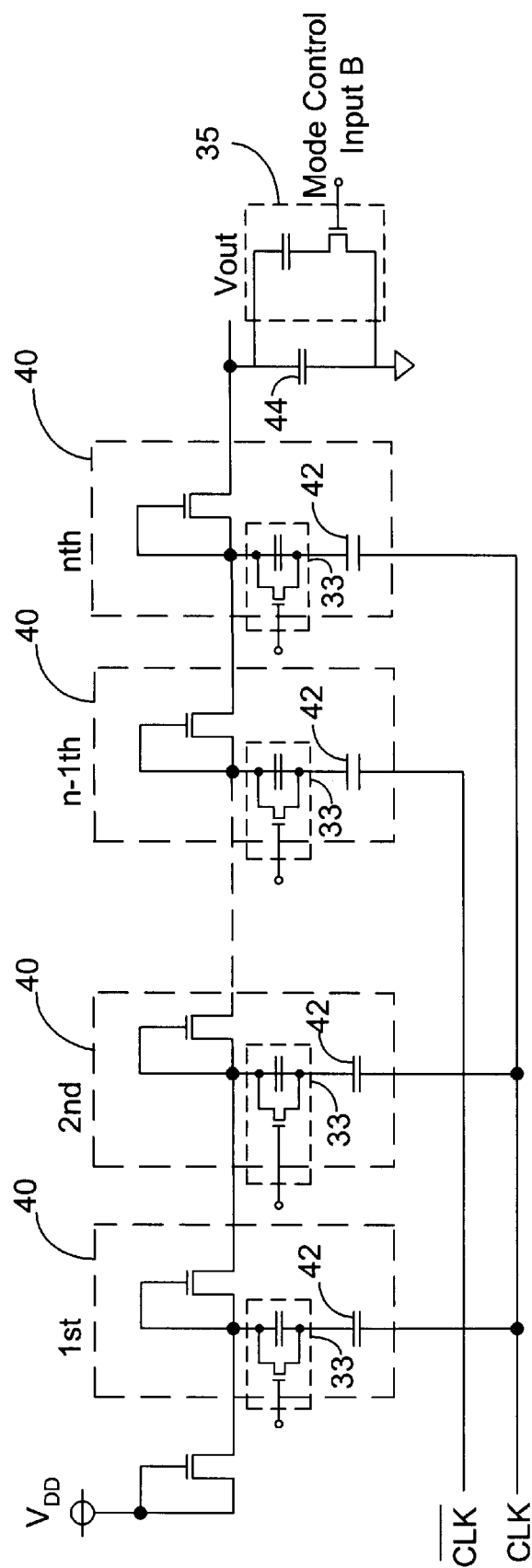
FIG. 3B illustrates another conventional charge pump.

Referring to FIG. 3B, a multistage charge pump circuit 12b is illustrated. The charge pump circuit 12b uses two clock signals to permit multiple boost stages 40 to be series connected. A series capacitor 42 is included in each of the boost stages. A single storage capacitor 44 is coupled to the output of the charge pump circuit 12b. Similar to charge pump circuit 12a, charge rate circuits 33 and 35 are coupled to the series capacitors 42 and the storage capacitor 44.

Again referring to FIG. 1, the filter 14 employed in the presently preferred embodiment is a low pass filter comprised of a resistor and capacitor. Although a discrete capacitor is used, it is within the scope of the invention to use the parasitic capacitance of the voltage buffer 16, or to not include the filter 14. The scope of the invention also includes using other low pass filters such as an inductor-capacitor filter.

In the presently preferred embodiment, the voltage buffer 16 is an NMOS transistor configured as a voltage follower. The scope of the invention additionally includes using other well known voltage buffer circuits such as bipolar transistors configured as voltage followers.

The pump controller 24 in the presently preferred embodiment comprises a one-shot 50, a counter 52, and a decoder 54. Although a oneshot and decoder are included in the presently preferred embodiment, the scope of the invention includes using merely a measuring device, such as a pulse counter, time measuring circuit, or energy measuring circuit, to control the charge pump 12. The measuring device is used to measure a mode criteria such as clock pulses, energy charging cycles, time elapsed following a predetermined event, or energy transferred to a storage device such as the filter 14. The mode of the charge pump 12 is adjusted based on the measured mode criteria.

The one-shot of the presently preferred embodiment provides a reset signal to the counter 52 when the amplifier 20 changes to an energy transferring state. The counter 52 of the preferred embodiment measures the number of clock pulses applied to the charge pump 12. The decoder 54 generates a set of mode control signals based upon the output of the counter 52. The set of mode control signals ranges from one signal up to a signal for each of the charge rate circuits that are included within the charge pump 12. The decoder controls the charge rate circuits to implement a mode strategy associated with the mode criteria. The scope of the invention encompasses mode strategies such as 1) transferring a first quantity of energy followed by successively smaller quantities of energy, and 2) transferring multiple packets of a first energy level followed by multiple packets of a second energy level, followed by packets of a third energy level and a fourth energy level. The mode strategy may also be implemented by the measurement device such as the counter 52. In the case of a parallel counter, several of the outputs may be used in combination to implement a simple mode strategy to control the charge pump 12. The decoder 54 may additionally be coupled to the clock generator 26 for controlling the frequency of the clock pulses to further refine the mode strategy.

The clock generator 26 in the presently preferred embodiment comprises an oscillator 56 for generating a train of clock pulses and a programmable counter 58 for decreasing the frequency of the pulse train. Those skilled in the art will readily recognize that there numerous methods for decreasing the frequency of a pulse train, all of which are included within the scope of the invention. An example of one such method includes using a non-programmable counter in combination with a one-shot 60. The non-programmable counter is set to a predetermined count based upon a circuit parameter such as leakage currents that are measured after the semiconductor device is manufactured. More complex control schemes may be devised when using a programmable counter 58 that is controlled by another device during circuit operation, such as the decoder 54.

For example, in the presently preferred embodiment the mode criteria is the number of clock pulses generated by the driver 22 after the amplifier 20 changes to the energy transferring state. The decoder 54 controls the charge pump 12 such that a large quantity of energy is transferred by the first pulse, followed by successively smaller quantities of energy for each of the following pulses.

Figure 2:
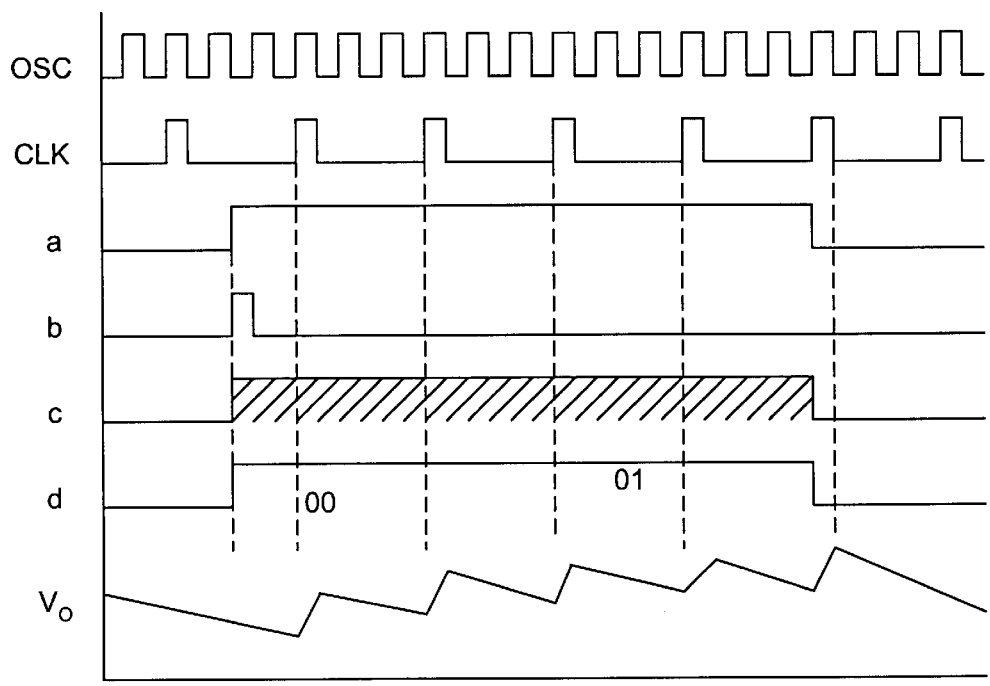
FIG. 2 illustrates a timing diagram associated with a presently preferred embodiment of the invention.

Referring to FIG. 2, timing waveforms associated with the operation of the presently preferred embodiment of the variable slope charge pump regulator circuit 10 are illustrated. Waveform "a" shows the output of the amplifier 20. Waveform "b" shows the output of the one shot 50. Waveform "c" shows the output of the counter 52. Waveform "d" shows the output of the decoder 54. Waveform "Vo" shows the output voltage of the regulator circuit 10. The decoder 54 is configured to provide two energy levels. During the first two clock cycles, the decoder 54 sets the charge pump 12 to energy level three to quickly increase the output voltage. During subsequent clock cycles, the decoder 54 sets the charge pump 12 to energy level one to insure the output voltage does not overshoot the desired value.

Thus it will be appreciated from the above that as a result of the present invention, a circuit and method for regulating a voltage is provided by which the principal objectives, among others, are completely fulfilled. It will be equally apparent and is contemplated that modification and/or changes may be made in the illustrated embodiment without departure from the invention. Accordingly, it is expressly intended that the foregoing description and accompanying drawings are illustrative of preferred embodiments only, not limiting, and that the true spirit and scope of the present invention will be determined by reference to the appended claims and their legal equivalent.

What is claimed is:

1. A regulator circuit for providing a regulated voltage, comprising:
    a driver for generating a drive signal;
    a charge pump, being responsive to the drive signal, to generate a pump voltage from a first voltage source, the charge pump having at least two charging modes;
    an amplifier having a reference input coupled to a reference voltage, a sense input coupled to a sense signal representative of the pump voltage, and an output, operable in response to a difference between the reference voltage and the sense signal, to control the driver; and
    a pump controller being coupled from the amplifier output to the charge pump, the pump controller including a counter and a decoder, being operable in response to mode criteria, to select a charging mode of the charge pump.

2. The circuit of claim 1 further including a voltage buffer coupled between a second voltage source and the charge pump output so that an output voltage corresponding to the pump voltage is generated.

3. The circuit of claim 2 further including a sense circuit coupled between the voltage buffer and the amplifier sense input.

4. A regulator circuit for providing a regulated voltage, comprising:
    a driver for generating a drive signal;
    a charge pump, being responsive to the drive signal, to generate a pump voltage from a first voltage source, the charge pump having at least two charging modes;
    an amplifier having a reference input coupled to a reference voltage, a sense input coupled to a sense signal representative of the pump voltage, and an output, operable in response to a difference between the reference voltage and the sense signal, to control the driver; and
    a pump controller being coupled from the amplifier output to the charge pump, the pump controller including a measuring device, being operable in response to mode criteria, to select a charging mode of the charge pump, wherein the measuring circuit is selected from the group of pulse counters, time measuring circuits, and energy measuring circuits.

5. A regulator circuit for providing a regulated voltage, comprising:
    a driver for generating a drive signal;
    a charge pump, being responsive to the drive signal, to generate a pump voltage from a first voltage source, the charge pump having at least two charging modes;
    an amplifier having a reference input coupled to a reference voltage, a sense input coupled to a sense signal representative of the pump voltage, and an output, operable in response to a difference between the reference voltage and the sense signal, to control the driver; and
    a pump controller being coupled from the amplifier output to the charge pump, the pump controller including a measuring device, being operable in response to mode criteria, to select a charging mode of the charge pump, wherein the mode criteria is selected from the group of clock pulses, energy charging cycles, time elapsed following a predetermined event, and energy transferred to the output voltage.

6. A regulator circuit for providing a regulated voltage, comprising:
    a driver for generating a drive signal;
    a charge pump, being responsive to the drive signal, to generate a pump voltage from a first voltage source, the charge pump having at least two charging modes;
    an amplifier having a reference input coupled to a reference voltage, a sense input coupled to a sense signal representative of the pump voltage, and an output, operable in response to a difference between the reference voltage and the sense signal, to control the driver; and
    a pump controller being coupled from the amplifier output to the charge pump, the pump controller including a measuring device, being operable in response to mode criteria, to select a charging mode of the charge pump, wherein the pump controller further includes a decoder for generating a set of mode control signals to control the charging mode of the charge pump.

7. The circuit of claim 6 wherein the decoder generates the set of mode control signals based on a mode strategy.

8. The circuit of claim 7 wherein the mode strategy is selected from the group of 1) transferring a first quantity of energy followed by successively smaller quantities of energy, and 2) transferring multiple packets of a first energy level followed by multiple packets of a second energy level, followed by packets of a third energy level.

9. The circuit of claim 8 wherein the pump controller further includes a one-shot coupled between the amplifier and measuring device for resetting the measuring device.

10. A regulator circuit for providing a regulated voltage, comprising:
    a driver for generating a drive signal;
    a charge pump, being responsive to the drive signal, to generate a pump voltage from a first voltage source, the charge pump having at least two charging modes;
    an amplifier having a reference input coupled to a reference voltage, a sense input coupled to a sense signal representative of the pump voltage, and an output, operable in response to a difference between the reference voltage and the sense signal, to control the driver;
    a pump controller being coupled from the amplifier output to the charge pump, the pump controller including a measuring device, being operable in response to mode criteria, to select a charging mode of the charge pump; and a clock generator coupled to the driver for generating a clock signal having a pulse frequency.

11. The circuit of claim 10 wherein the clock generator comprises an oscillator and a programmable counter.

12. The circuit of claim 6 further comprising a clock generator for generating a clock signal being coupled to the driver, the clock generator including an oscillator and a programmable counter, the programmable counter being coupled to the decoder such that the pulse frequency of the clock signal is controlled by the decoder in response to a mode strategy.

13. A regulator circuit for providing a regulated voltage, comprising:

driver means for generating a drive signal;

charge pump means for generating a pump voltage from a first voltage source in response to the drive signal, the charge pump means providing at least two charging modes;

amplifier means for controlling the driver means in response to a reference voltage and a sense signal representative of the pump voltage, the amplifier means being operable in response to a difference between the reference voltage and the sense signal; and pump controller means for selecting a charging mode of the charge pump means in response to mode criteria, the pump controller means being coupled from the amplifier means to the charge pump means, wherein the pump controller means comprises a counting means and a decoder means.

14. The circuit of claim 13 further including voltage buffer means for generating an output voltage corresponding to the pump voltage, the voltage buffer means being coupled between a second voltage source and the charge pump means.

15. The circuit of claim 14 further including sense circuit means for generating the sense signal.

16. A regulator circuit for providing a regulated voltage, comprising:

driver means for generating a drive signal;

charge pump means for generating a pump voltage from a first voltage source in response to the drive signal, the charge pump means providing at least two charging modes;

amplifier means for controlling the driver means in response to a reference voltage and a sense signal representative of the pump voltage, the amplifier means being operable in response to a difference between the reference voltage and the sense signal; and pump controller means for selecting a charging mode of the charge pump means in response to mode criteria, the pump controller means being coupled from the amplifier means to the charge pump means, wherein the mode criteria is selected from the group of clock pulses, energy charging cycles, time elapsed following a predetermined event, and energy transferred to the output voltage.

17. A regulator circuit for providing a regulated voltage, comprising:

driver means for generating a drive signal;

charge pump means for generating a pump voltage from a first voltage source in response to the drive signal, the charge pump means providing at least two charging modes;

amplifier means for controlling the driver means in response to a reference voltage and a sense signal representative of the pump voltage, the amplifier means being operable in response to a difference between the reference voltage and the sense signal; and pump controller means for selecting a charging mode of the charge pump means in response to mode criteria, the pump controller means being coupled from the amplifier means to the charge pump means, wherein the pump controller means further generates a set of mode control signals to control the charging mode of the charge pump means.

18. The circuit of claim 17 wherein the pump controller means generates the set of mode control signals based on a mode strategy.

19. The circuit of claim 18 wherein the mode strategy is selected from the group of 1) transferring a first quantity of energy followed by successively smaller quantities of energy, and 2) transferring multiple packets of a first energy level followed by multiple packets of a second energy level, followed by packets of a third energy level.

20. A regulator circuit for providing a regulated voltage, comprising:

driver means for generating a drive signal;

charge pump means for generating a pump voltage from a first voltage source in response to the drive signal, the charge pump means providing at least two charging modes;

amplifier means for controlling the driver means in response to a reference voltage and a sense signal representative of the pump voltage, the amplifier means being operable in response to a difference between the reference voltage and the sense signal;

pump controller means for selecting a charging mode of the charge pump means in response to mode criteria, the pump controller means being coupled from the amplifier means to the charge pump means; and comprising clock means for generating a clock signal having a pulse frequency, the clock means being coupled to the driver.

21. The circuit of claim 17 further comprising a clock means for generating a programmable clock signal, the clock means being coupled to the pump controller means such that a pulse frequency of the clock signal is controlled by the pump controller means in response to a mode strategy.

22. A method for providing a regulated voltage, comprising:

generating a drive signal;

counting a clock signal;

decoding a mode criteria in accordance with the counting step;

selecting a charging mode, based upon the mode criteria, for generating a pump voltage;

generating the pump voltage from a first voltage source in response to the drive signal and selected charging mode;

generating a sense signal representative of the pump voltage; and controlling the drive signal in response to determining a difference between a reference voltage and the sense signal.

23. The method of claim 22 further including the step of generating an output voltage corresponding to the pump voltage.

24. A method for providing a regulated voltage, comprising:

generating a drive signal;

selecting a charging mode, based upon mode criteria, for generating a pump voltage;

generating the pump voltage from a first voltage source in response to the drive signal and selected charging mode;

generating a sense signal representative of the pump voltage; and controlling the drive signal in response to determining a difference between a reference voltage and the sense signal, wherein the mode criteria is selected from the group of clock pulses, energy charging cycles, time elapsed following a predetermined event, and energy transferred to the output voltage.

25. A method for providing a regulated voltage, comprising:

generating a drive signal;

selecting a charging mode, based upon mode criteria, for generating a pump voltage;

generating the pump voltage from a first voltage source in response to the drive signal and selected charging mode;

generating a sense signal representative of the pump voltage;

controlling the drive signal in response to determining a difference between a reference voltage and the sense signal; and generating a set of mode control signals to control the charging mode.

26. The method of claim 25 wherein the step of generating a set of mode control signals further includes generating the set of mode control signals based on a mode strategy.

27. The method of claim 26 wherein the mode strategy is selected from the group of 1) transferring a first quantity of energy followed by successively smaller quantities of energy, and 2) transferring multiple packets of a first energy level followed by multiple packets of a second energy level, followed by packets of a third energy level.

28. A method for providing a regulated voltage, comprising:

generating a drive signal;

selecting a charging mode, based upon mode criteria, for generating a pump voltage;

generating the pump voltage from a first voltage source in response to the drive signal and selected charging mode;

generating a sense signal representative of the pump voltage;

controlling the drive signal in response to determining a difference between a reference voltage and the sense signal; and controlling the drive signal with a clock signal having a pulse frequency.

29. The method of claim 25 further including the steps of generating a programmable clock signal having a pulse frequency; controlling the pulse frequency of the clock signal in response to a mode strategy; and controlling the drive signal with controlled clock signal.

* * * * *

UNITED STATES PATENT AND TRADEMARK OFFICE
CERTIFICATE OF CORRECTION

PATENT NO. : 6,320,796 B1
DATED : November 20, 2001
INVENTOR(S) : Voo, Thart Fah et al.

It is certified that error appears in the above-identified patent and that said Letters Patent is hereby corrected as shown below:

<u>Title page,</u>
Insert -- [75] Inventors: Thart Fah Voo, Singapore (SG); Sehat Sutardja, Cupertino, CA (US) --

Signed and Sealed this

Thirtieth Day of April, 2002

Attest:

Attesting Officer

JAMES E. ROGAN
*Director of the United States Patent and Trademark Office*